(12) United States Patent
Kobayashi et al.

(10) Patent No.: US 8,226,865 B2
(45) Date of Patent: Jul. 24, 2012

(54) ALUMINUM-NITRIDE-BASED COMPOSITE MATERIAL, METHOD FOR MANUFACTURING THE SAME, AND MEMBER FOR A SEMICONDUCTOR MANUFACTURING APPARATUS

(75) Inventors: Yoshimasa Kobayashi, Nagoya (JP); Akira Goto, Ichinomiya (JP); Yuji Katsuda, Tsushima (JP); Naohito Yamada, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 378 days.

(21) Appl. No.: 12/581,307

(22) Filed: Oct. 19, 2009

(65) Prior Publication Data
US 2010/0104892 A1 Apr. 29, 2010

Related U.S. Application Data

(60) Provisional application No. 61/107,756, filed on Oct. 23, 2008.

(30) Foreign Application Priority Data

Mar. 24, 2009 (JP) .................. 2009-072305
Sep. 17, 2009 (JP) .................. 2009-216178

(51) Int. Cl.
*B29C 67/00* (2006.01)

(52) U.S. Cl. ........ 264/125; 264/332; 264/668; 264/681; 501/98.4; 501/98.5

(58) Field of Classification Search .................. 264/125, 264/332, 668, 681; 428/698, 702; 501/98.4, 501/98.5
See application file for complete search history.

(56) References Cited

U.S. PATENT DOCUMENTS

| 4,746,637 | A | | 5/1988 | Kasori et al. |
| 5,229,339 | A | | 7/1993 | Pujari et al. |
| 5,874,378 | A | * | 2/1999 | Ishida et al. ................. 501/98.4 |
| 6,239,402 | B1 | * | 5/2001 | Araki et al. ................. 219/121.4 |
| 7,122,490 | B2 | * | 10/2006 | Kobayashi et al. .......... 501/98.4 |
| 7,422,992 | B2 | * | 9/2008 | Teratani et al. .............. 501/98.5 |
| 7,564,008 | B2 | | 7/2009 | Mori et al. |
| 2004/0126502 | A1 | | 7/2004 | Ferrato et al. |
| 2006/0217259 | A1 | | 9/2006 | Teratani et al. |
| 2007/0135293 | A1 | * | 6/2007 | Kobayashi et al. .......... 501/98.4 |
| 2007/0215840 | A1 | * | 9/2007 | Yoshikawa et al. ........... 252/500 |

FOREIGN PATENT DOCUMENTS

| JP | 2006-196864 A1 | 7/2006 |
| JP | 2007-084367 | 4/2007 |

OTHER PUBLICATIONS

Kume et al. ("Effects of MgO addition on the density and dielectric loss of AIN ceramics sintered in presence of Y2O3", Journal of the European Ceramic Society, vol. 25, (2005) pp. 2791-2794.*
European Search Report from corresponding European Patent Application No. 09252457.8 bearing a mailing date of Apr. 20, 2012, pp. 1-10.

* cited by examiner

*Primary Examiner* — Jonathan Langman
(74) *Attorney, Agent, or Firm* — Burr & Brown

(57) ABSTRACT

The aluminum-nitride-based composite material according to the present invention is an aluminum-nitride-based composite material that is highly pure with the content ratios of transition metals, alkali metals, and boron, respectively as low as 1000 ppm or lower, has AlN and MgO constitutional phases, and additionally contains at least one selected from the group consisting of a rare earth metal oxide, a rare earth metal-aluminum complex oxide, an alkali earth metal-aluminum complex oxide, a rare earth metal oxyfluoride, calcium oxide, and calcium fluoride, wherein the heat conductivity is in the range of 40 to 150 W/mK, the thermal expansion coefficient is in the range of 7.3 to 8.4 ppm/° C., and the volume resistivity is $1 \times 10^{14}$ Ω·cm or higher.

5 Claims, No Drawings

US 8,226,865 B2

ALUMINUM-NITRIDE-BASED COMPOSITE MATERIAL, METHOD FOR MANUFACTURING THE SAME, AND MEMBER FOR A SEMICONDUCTOR MANUFACTURING APPARATUS

BACKGROUND OF THE INVENTION

1. Field of the Invention

The present invention relates to an aluminum-nitride based composite material, a method for manufacturing the aluminum-nitride based composite material, and a member for a semiconductor manufacturing apparatus.

2. Description of the Related Art

Known members for a semiconductor manufacturing apparatus include electrostatic chucks composed of sintered alumina and electrodes embedded in it, heaters composed of sintered alumina and resistance heating elements embedded in it, and so forth (for example, see Patent Document 1).

[Patent Documents]

[Patent Document 1] Japanese Unexamined Patent Application Publication No. 2006-196864

SUMMARY OF THE INVENTION

However, sintered alumina, which has a heat conductivity of approximately 30 W/mK, is insufficient in terms of thermal uniformity on chucked wafer, response to increase/decrease in temperature, and corrosion resistant performance and durability against halogen plasma gases. This has led to demand for a novel material that is comparable in terms of volume resistivity and superior in terms of heat conductivity and corrosion resistant performance to alumina. There is also another possible solution: an electrostatic chuck having a dielectric layer made of sintered alumina and a base material supporting it made of such a novel material, with the two members bonded to each other. The novel material used in this configuration must have a thermal expansion coefficient controlled near that of alumina, 7.9 ppm/° C., at a temperature in the range of 25 to 800° C.

The present invention solves this problem with the primary object thereof, namely, by providing a novel material that is comparable in terms of thermal expansion coefficient and volume resistivity and superior in terms of heat conductivity and corrosion resistant performance to alumina.

MEANS FOR SOLVING THE PROBLEMS

An aluminum-nitride-based composite material according to the present invention is an aluminum-nitride-based composite material that is highly pure with the content ratios of transition metals (excluding rare earth metals), alkali metals, and boron, respectively as low as 1000 ppm or lower, has AlN and MgO constitutional phases, and additionally contains at least one selected from the group consisting of a rare earth metal oxide, a rare earth metal-aluminum complex oxide, an alkali earth metal-aluminum complex oxide, a rare earth metal oxyfluoride, calcium oxide, and calcium fluoride, wherein the heat conductivity is in the range of 40 to 150 W/mK, the thermal expansion coefficient is in the range of 7.3 to 8.4 ppm/° C., and the volume resistivity is $1 \times 10^{14}$ Ω·cm or higher.

A method for manufacturing an aluminum-nitride-based composite material according to the present invention includes a step of hot-press sintering of a mixture containing aluminum nitride at a content ratio in the range of 49.8 to 69.4 vol %; magnesium oxide at a content ratio in the range of 20.2 to 40.0 vol %; and a rare earth metal oxide at a content ratio in the range of 0.5 to 30.0 vol % and/or at least one selected from the group consisting of a rare earth metal fluoride, an alkali earth metal fluoride, calcium oxide, and aluminum fluoride at a content ratio in the range of 0.5 to 5.7 vol %; with the content ratios of transition metals (excluding rare earth metals), alkali metals, and boron, respectively as low as 1000 ppm or lower. This manufacturing method can be suitably used in manufacturing the aluminum-nitride-based composite material according to the present invention.

A member for a semiconductor manufacturing apparatus according to the present invention is one using the aluminum-nitride-based composite material described above or one composed of a first structure using the aluminum-nitride-based composite material and a second structure, which is using aluminum oxide or yttrium oxide, bonded to the first structure.

ADVANTAGES

The aluminum-nitride-based composite material according to the present invention is a novel material that is comparable in terms of volume resistivity and superior in terms of heat conductivity and corrosion resistant performance to sintered alumina; thus, it can be used in semiconductor manufacturing apparatuses instead of sintered alumina as it is or after being bonded to sintered alumina.

This advantage is probably due to the following facts: the aluminum nitride improves heat conductivity; the magnesium oxide improves thermal expansion, electric resistance, and corrosion resistant performance; and the component(s) selected from a rare earth metal oxide, a rare earth metal-aluminum complex oxide, an alkali earth metal-aluminum complex oxide, a rare earth metal oxyfluoride, calcium oxide, and calcium fluoride improves the heat conductivity of the aluminum nitride and help it being sintered at a low temperature.

DESCRIPTION OF THE INVENTION

The aluminum-nitride-based composite material according to the present invention is an aluminum-nitride-based composite material that is highly pure with the content ratios of transition metals (excluding rare earth metals), alkali metals, and boron, respectively as low as 1000 ppm or lower, has AlN and MgO constitutional phases, and additionally contains at least one selected from the group consisting of a rare earth metal oxide, a rare earth metal-aluminum complex oxide, an alkali earth metal-aluminum complex oxide, a rare earth metal oxyfluoride, calcium oxide, and calcium fluoride, wherein the heat conductivity is in the range of 40 to 150 W/mK, the thermal expansion coefficient is in the range of 7.3 to 8.4 ppm/° C., and the volume resistivity is $1 \times 10^{14}$ Ω·cm or higher.

Examples of applicable rare earth metal oxides include $Sc_2O_3$, $Y_2O_3$, $La_2O_3$, $CeO_2$, $Pr_2O_3$, $Nd_2O_3$, $Pm_2O_3$, $Sm_2O_3$, $Eu_2O_3$, $Gd_2O_3$, $Tb_2O_3$, $Ho_2O_3$, $Er_2O_3$, $Tm_2O_3$, $Yb_2O_3$, and $Lu_2O_3$, with preferred examples being $Y_2O_3$, $Dy_2O_3$, $Ho_2O_3$, $Er_2O_3$, $Tm_2O_3$, $Yb_2O_3$, and $Lu_2O_3$ and particularly preferred examples being $Y_2O_3$ and $Yb_2O_3$. Examples of applicable rare earth metal-aluminum complex oxides, provided that the rare earth metal is yttrium, include YAG ($Y_3Al_5O_{12}$), YAL ($YAlO_3$), YAM ($Y_4Al_2O_9$), and so forth. Examples of applicable alkali earth metal-aluminum complex oxides include $MgAl_2O_4$, provided that the alkali earth metal is magnesium, and $Ca_3Al_2O_6$, provided that the alkali earth metal is calcium. Examples of applicable rare earth metal oxyfluorides include ScOF, YOF, LaOF, CeOF, PrOF, NdOF, PmOF, SmOF, EuOF, GdOF, TbOF, DyOF, HoOF, ErOF, TmOF, YbOF, and LuOF, with preferred examples being YOF and YbOF.

The group mentioned above in the description of the aluminum-nitride-based composite material according to the present invention may consist of $RE_2O_3$, $RE_3Al_5O_{12}$, $REAlO_3$, $RE_4Al_2O_9$, REOF, CaO, $CaF_2$, $MgAl_2O_4$, and $Ca_3Al_2O_6$, wherein RE represents a rare earth metal. The rare earth metal is preferably yttrium or ytterbium.

With the heat conductivity as high as 40 to 150 W/mK, the aluminum-nitride-based composite material according to the present invention is highly responsive to heater-controlled decrease/increase in temperature. Due to a thermal expansion coefficient in the range of 7.3 to 8.4 ppm/° C., which is close to the same parameter of alumina, the composite material can be easily bonded to sintered alumina with adhesiveness high enough to avoid detachment. Moreover, the volume resistivity as high as $1 \times 10^{14}$ Ω·cm or higher allows the composite material to be used as a highly insulating material, for example, a material for electrostatic chucks. Furthermore, a fluorine plasma etching rate as low as 0.2- to 0.6-fold that of alumina provides the composite material with high durability. Therefore, this aluminum-nitride-based composite material can be suitably used as a member for a semiconductor manufacturing apparatus.

Preferably, the aluminum-nitride-based composite material has an open porosity of at most 0.5% and has a grain diameter of at most 3 μm.

The method for manufacturing an aluminum-nitride-based composite material according to the present invention includes a step of hot-press sintering of a mixture containing aluminum nitride at a content ratio in the range of 35 to 75 vol %; magnesium oxide at a content ratio in the range of 20 to 50 vol %; and at least one selected from the group consisting of a rare earth metal oxide, a rare earth metal fluoride, an alkali earth metal fluoride, calcium oxide, and aluminum fluoride at a content ratio in the range of 0.5 to 30 vol %; however, this method preferably includes a step of hot-press sintering of a mixture containing aluminum nitride at a content ratio in the range of 49.8 to 69.4 vol %; magnesium oxide at a content ratio in the range of 20.2 to 40.0 vol %; and a rare earth metal oxide at a content ratio in the range of 0.5 to 30.0 vol % and/or at least one selected from the group consisting of a rare earth metal fluoride, an alkali earth metal fluoride, calcium oxide, and aluminum fluoride at a content ratio in the range of 0.5 to 5.7 vol %; with the content ratios of transition metals (excluding rare earth metals), alkali metals, and boron, respectively as low as 1000 ppm or lower.

The content ratio of aluminum nitride is preferably in the range of 35 to 75 vol % and more preferably in the range of 49.8 to 69.4 vol %. A content ratio of higher than 75 vol % is unfavorable because it results in an excessively decreased thermal expansion coefficient, making the resultant composite material difficult to bond to sintered alumina. However, a content ratio of lower than 35 vol % is also unfavorable because it gives an insufficiently improved thermal expansion coefficient to the resultant composite material.

The content ratio of magnesium oxide is preferably in the range of 20 to 50 vol % and more preferably in the range of 20.2 to 40.0 vol %. A content ratio of higher than 50 vol % is unfavorable because it results in decreases in heat conductivity and mechanical strength and an excessive increase in thermal expansion coefficient, making the resultant composite material difficult to bond to sintered alumina. However, a content ratio of lower than 20 vol % is also unfavorable because it results in reduced corrosion resistant performance and an excessively decreased thermal expansion coefficient, making the resultant composite material difficult to bond to sintered alumina after all.

The content ratio of the component(s) selected from the group consisting of a rare earth metal oxide, a rare earth metal fluoride, an alkali earth metal fluoride, calcium oxide, and aluminum fluoride is preferably in the range of 0.5 to 30 vol %. A content ratio of higher than 30 vol % is unfavorable because it results in decrease in the heat conductivity and mechanical strength of the resultant composite material. However, a content ratio of lower than 0.5 vol % is also unfavorable because it results in improved insufficiently heat conductivity of aluminum nitride and sinterability at a low temperature. The rare earth metal is preferably yttrium or ytterbium. Note that the preferred range of content ratio is 0.5 to 30.0 vol % for the rare earth metal oxide and is 0.5 to 5.7 vol % for the component(s) selected from the group consisting of a rare earth metal fluoride, an alkali earth metal fluoride, calcium oxide, and aluminum fluoride. The rare earth metal oxide mainly improves heat conductivity, the rare earth metal fluoride, alkali earth metal fluoride, and aluminum fluoride mainly helps aluminum nitride being sintered at a low temperature, and calcium oxide provides both contributions.

The mixture used in the method for manufacturing an aluminum-nitride-based composite material according to the present invention contains transition metals (excluding rare earth metals), alkali metals, and boron at content ratios equal to or lower than 1000 ppm. For example, boron nitride inhibits the improvement of heat conductivity; however, the influence thereof is negligible in this method due to such a low content ratio. Also, transition metals (excluding rare earth metals), alkali metals, and boron, when corroded by plasma, splash within a semiconductor manufacturing apparatus, thereby reducing the yield in some cases by making plasma unstable and contaminating the resultant semiconductor products; however, the influence of this event is also negligible in this method due to the low content ratios of the elements.

The hot press used in the method for manufacturing an aluminum-nitride-based composite material according to the present invention allows the resultant composite material to be densified to a density high enough for a high heat conductivity.

When the AlN is sintered with additives such as $Y_2O_3$, $YF_3$, $CaF_2$, and CaO, sintering at a higher temperature results in a higher heat conductivity of the resultant sintered body because oxygen dissolved in AlN grains is trapped in grain boundaries by the additives. When the AlN is sintered with MgO instead, however, sintering at a lower temperature results in a higher heat conductivity of the resultant sintered body because MgO are dissolved in AlN grains at a high sintering temperature. This means that sintering of AlN with both $Y_2O_3$ and MgO may result in a low heat conductivity of the sintered body when sintered at too high a temperature; thus, the sintering temperature is preferably equal to or lower than 1800° C., more preferably in the range of 1350 to 1600° C., and even more preferably in the range of 1400 to 1600° C., and this is the reason that the use of a hot press, which allows the AlN to be densified at a low temperature, is preferred. The pressure applied by the hot press is preferably in the range of 50 to 300 kgf/cm². The time of sintering with a hot press is not particularly limited; however, it is preferably in the range of 1 to 5 hours. The hot press sintering step is conducted in vacuum atmosphere or in an inert gas atmosphere, and an example schedule thereof is as follows: heating from room temperature to a predetermined temperature (e.g., 1000° C. or 1100° C.) is carried out in vacuum atmosphere, then heating from the predetermined temperature to sintering temperature is carried out in an inert gas atmosphere, and then the sintering temperature is maintained in the inert gas atmosphere. In addition, the predetermined temperature may be the same as the sintering temperature. Note that the inert gas atmosphere mentioned herein represents a gas atmosphere that has no effect on sintering, for example, nitrogen gas atmosphere, helium gas atmosphere, and argon gas atmosphere.

Incidentally, pressureless sintering of the AlN often results in insufficient density, necessitating that sintering temperature be high for a high density; however, this condition leads to decreases in the amounts of AlN and MgO in the constitutional phases and allows $MgAl_2O_4$ formation, thereby resulting in a decreased heat conductivity and reduced corrosion resistant performance. While the cause is unknown, the reaction expressed by the equation indicated below probably occurs during pressureless sintering. The use of a hot press can prevent this reaction from occurring. This is probably because the closed die of a hot press prevents the materials contained therein from reaction with gas generation and allows the materials to be densified at a lower temperature.

$$2AlN + 4MgO \rightarrow MgAl_2O_4 + 3Mg + N_2$$

The method for manufacturing an aluminum-nitride-based composite material according to the present invention allows the use of composite powder that is a combination of two or more kinds of material particles constituting the mixture. For example, the composite powder may be composite particles each of which has an aluminum nitride particle or a magnesium oxide particle coated with a rare earth metal oxide on surface.

The member for a semiconductor manufacturing apparatus according to the present invention is one using the aluminum-nitride-based composite material described above or one composed of a first structure using the aluminum-nitride-based composite material and a second structure, which is using aluminum oxide or yttrium oxide, bonded to the first structure. An example method for bonding the second structure to the first structure is as follows: the second structure is sintered, and then one face thereof is polished; electrode paste is printed on the polished face; material powder for the first structure is shaped into the first structure on the face of the second structure on which the electrode paste has been printed, and then the composite obtained is sintered in a hot press at a temperature in the range of 1350 to 1600° C. The resultant member for a semiconductor manufacturing apparatus is composed of the first and second structures bonded to each other and a plate electrode sandwiched between the two structures.

EXAMPLES

Aluminum nitride, magnesia, and other additives were blended in accordance with the formulations specified in Table 1, and the material powder samples obtained were named Examples 1 to 34 and Comparative Examples 1 to 7. The aluminum nitride powder, magnesia powder, and yttria powder used were all commercially available products. More specifically, the following products were used: AlN, Grade H manufactured by Tokuyama Corporation (impurities are shown in Table 2 below); MgO, T manufactured by Kyowa Chemical Industry Co., Ltd. with a minimum purity of 99.4% (impurities are shown in Table 2 below); $Y_2O_3$, UU-HP manufactured by Shin-Etsu Chemical Co., Ltd. with a minimum purity of 99.9%; $CaF_2$, a product manufactured by Kojundo Chemical Laboratory Co., Ltd. with a minimum purity of 99.9%; $Yb_2O_3$, a product manufactured by Shin-Etsu Chemical Co., Ltd. with a minimum purity of 99.9%; $YbF_3$, a product manufactured by Kojundo Chemical Laboratory Co., Ltd. with a minimum purity of 99.9%; $YF_3$, a product manufactured by Kojundo Chemical Laboratory Co., Ltd. with a minimum purity of 99.9%; $MgF_2$, a product manufactured by Kojundo Chemical Laboratory Co., Ltd. with a minimum purity of 99.9%; $AlF_3$, a product manufactured by Kojundo Chemical Laboratory Co., Ltd. with a minimum purity of 99.9%; and $CaCO_3$, Silver-W manufactured by Shiraishi Kogyo Kaisha, Ltd. Isopropyl alcohol was added as solvent to the formulated material powder samples, and then each mixture was wet-blended in a nylon pot with balls for 4 hours. After the completion of blending, the resultant slurry was dried at 110° C. In this way, material powder samples for sintering were obtained. Then, each material powder sample for sintering was uniaxially compacted in a mold, with the pressure being 200 kgf/cm², into a disk measuring 50 mm in diameter and 20 mm in thickness. Each of the disks obtained was placed in a graphite mold and then sintered by a hot press. In this way, sintered body was obtained. The conditions for hot press sintering were as follows: pressure: 200 kgf/cm²; sintering temperature: 1400 to 1800° C.; time of sintering: 2 hours; sintering schedule: heating from room temperature to 1000° C. was carried out in vacuum atmosphere, then heating from 1000° C. to the maximum temperature was carried out in nitrogen gas atmosphere introduced with a pressure of 1.5 kgf/cm². Example 22 was produced using a method slightly different from those used in others, in which aluminum nitride particles were coated with yttria powder in a powder processor (Nobilta manufactured by Hosokawa Micron Corporation) and then the composite particles obtained were blended with magnesia. The method for bonding disks to an alumina or yttria material was as follows: an alumina or yttria disk measuring 50 mm in diameter and 5 mm in thickness was sintered, one face thereof was polished, then each material powder sample was shaped into a disk on the alumina or yttria disk, and finally the structure obtained was sintered in a hot press at a temperature in the range of 1400 to 1800° C.

TABLE 1

| Sample number | AlN [vol %] | MgO [vol %] | $Y_2O_3$ or $Yb_2O_3$ [vol %] | $CaF_2$, $YF_3$, $YbF_3$, CaO, $MgF_2$ or $AlF_3$ [vol %] | Sintering temperature [° C.] |
|---|---|---|---|---|---|
| Example 1 | 63.9 | 35.6 | 0.5 ($Y_2O_3$) | 0.0 | 1600 |
| Example 2 | 63.6 | 35.4 | 1.1 ($Y_2O_3$) | 0.0 | 1600 |
| Example 3 | 58.0 | 40.0 | 2.0 ($Y_2O_3$) | 0.0 | 1500 |
| Example 4 | 58.0 | 40.0 | 2.0 ($Y_2O_3$) | 0.0 | 1600 |
| Example 5 | 62.9 | 35.0 | 2.1 ($Y_2O_3$) | 0.0 | 1600 |
| Example 6 | 67.7 | 30.0 | 2.3 ($Y_2O_3$) | 0.0 | 1600 |
| Example 7 | 69.4 | 28.2 | 2.4 ($Y_2O_3$) | 0.0 | 1600 |
| Example 8 | 69.4 | 28.2 | 2.4 ($Y_2O_3$) | 0.0 | 1800 |
| Example 9 | 62.1 | 34.6 | 3.3 ($Y_2O_3$) | 0.0 | 1600 |
| Example 10 | 60.4 | 24.6 | 15.0 ($Y_2O_3$) | 0.0 | 1600 |
| Example 11 | 60.4 | 24.6 | 15.0 ($Y_2O_3$) | 0.0 | 1800 |
| Example 12 | 49.8 | 20.2 | 30.0 ($Y_2O_3$) | 0.0 | 1600 |
| Example 13 | 49.8 | 20.2 | 30.0 ($Y_2O_3$) | 0.0 | 1800 |
| Example 14 | 59.8 | 24.4 | 14.9 ($Y_2O_3$) | 1.0 ($CaF_2$) | 1400 |
| Example 15 | 59.8 | 24.4 | 14.9 ($Y_2O_3$) | 1.0 ($CaF_2$) | 1600 |
| Example 16 | 58.6 | 23.9 | 14.6 ($Y_2O_3$) | 2.9 ($CaF_2$) | 1400 |
| Example 17 | 58.6 | 23.9 | 14.6 ($Y_2O_3$) | 2.9 ($CaF_2$) | 1600 |
| Example 18 | 65.6 | 31.5 | 0.0 | 2.9 ($CaF_2$) | 1500 |
| Example 19 | 65.6 | 31.5 | 0.0 | 2.9 ($CaF_2$) | 1600 |
| Example 20 | 62.3 | 29.9 | 2.1 ($Y_2O_3$) | 5.7 ($CaF_2$) | 1500 |
| Example 21 | 62.3 | 29.9 | 2.1 ($Y_2O_3$) | 5.7 ($CaF_2$) | 1600 |
| Example 22 | 62.3 | 29.9 | 2.1 ($Y_2O_3$) | 5.7 ($CaF_2$) | 1600 |
| Example 23 | 62.2 | 34.7 | 2.1 ($Yb_2O_3$) | 1.0 ($YF_3$) | 1450 |
| Example 24 | 62.2 | 34.7 | 2.1 ($Yb_2O_3$) | 1.0 ($YbF_3$) | 1450 |
| Example 25 | 62.2 | 34.7 | 2.1 ($Yb_2O_3$) | 1.0 ($YbF_3$) | 1475 |

TABLE 1-continued

| Sample number | AlN [vol %] | MgO [vol %] | Y$_2$O$_3$ or Yb$_2$O$_3$ [vol %] | CaF$_2$, YF$_3$, YbF$_3$, CaO, MgF$_2$ or AlF$_3$ [vol %] | Sintering temperature [° C.] |
|---|---|---|---|---|---|
| Example 26 | 62.6 | 34.9 | 0.0 | 2.5 (CaO) | 1600 |
| Example 27 | 62.2 | 34.7 | 2.1 (Y$_2$O$_3$) | 1.0 (MgF$_2$) | 1400 |
| Example 28 | 62.2 | 34.7 | 2.1 (Y$_2$O$_3$) | 1.0 (AlF$_3$) | 1400 |
| Example 29 | 62.2 | 34.7 | 2.1 (Y$_2$O$_3$) | 1.0 (MgF$_2$) | 1450 |
| Example 30 | 62.2 | 34.7 | 2.1 (Y$_2$O$_3$) | 1.0 (AlF$_3$) | 1450 |
| Example 31 | 62.2 | 34.7 | 2.1 (Y$_2$O$_3$) | 1.0 (MgF$_2$) | 1475 |
| Example 32 | 62.2 | 34.7 | 2.1 (Y$_2$O$_3$) | 1.0 (AlF$_3$) | 1475 |
| Example 33 | 62.5 | 34.8 | 2.1 (Y$_2$O$_3$) | 0.5 (MgF$_2$) | 1475 |
| Example 34 | 59.9 | 33.3 | 2.0 (Y$_2$O$_3$) | 4.8 (MgF$_2$) | 1475 |
| Comparative Example 1 | 71.1 | 28.9 | 0.0 | 0.0 | 1600 |
| Comparative Example 2 | 71.1 | 28.9 | 0.0 | 0.0 | 1800 |
| Comparative Example 3 | 50.0 | 0.0 | 50.0 (Y$_2$O$_3$) | 0.0 | 1800 |
| Comparative Example 4 | 65.0 | 0.0 | 35.0 (Y$_2$O$_3$) | 0.0 | 1800 |
| Comparative Example 5 | 80.0 | 0.0 | 20.0 (Y$_2$O$_3$) | 0.0 | 1800 |
| Comparative Example 6 | 62.3 | 29.9 | 2.1 (Y$_2$O$_3$) | 5.7 (CaF$_2$) | 1600 |
| Comparative Example 7 | 62.3 | 29.9 | 2.1 (Y$_2$O$_3$) | 5.7 (CaF$_2$) | 1700 |

TABLE 2

| Impurities of AlN powder (Grade H manufactured by Tokuyama Corporation) | |
|---|---|
| Fe | 43 ppm |
| K | <0.5 ppm |
| Na | 3.5 ppm |
| B | <1 ppm |
| Impurities of MgO powder | |
| Fe | <0.01 wt % |
| Ca | 0.09 wt % |
| K | <0.01 wt % |
| Na | <0.01 wt % |
| Cr | <0.01 wt % |
| Ni | <0.01 wt % |
| Li | <0.01 wt % |
| B | 0.02 wt % |

The products obtained were examined for the following properties. The results are shown in Tables 3 and 4. In Table 4, YAL and YAM represent YAlO$_3$ and Y$_4$Al$_2$O$_9$, respectively.

(1) Open porosity: Archimedes's method (2) Bulk density: Archimedes's method (3) Four-point flexural strength: Four-point flexural test specified in JIS R1601

(4) Fracture toughness: Calculation using the equation according to the median crack model (JIS R1607) with a load of 9.8 N (5) Heat conductivity: Laser flash method (6) Thermal expansion coefficient (40 to 800° C.): Dilatometer (7) Volume resistivity: The three-terminal DC resistance method specified in JIS C2141

(8) AlN grain diameter (microstructure observation): SEM imaging of the polished face for determination of an average grain diameter (9) Specific etching rate (relative to alumina's value): Plasma resistance test under the following conditions:

Gas flow: NF$_3$/O$_2$/Ar=75/35/140 sccm;
Degree of vacuum: 0.05 Torr;
ICP: 800 W with a bias of 450 W;
External temperature of the inner quartz tube: 24 to 99° C.;
Test duration: 5 hours; and
Measurement principle: surface-height difference between a masked face and an exposed face (measured with a height gauge).

Note that the specific etching rate mentioned herein means a ratio of the etching rate of a test sintered body to that of a sintered body based on alumina.

(10) Constitutional phases: Powder X-ray diffractoinetry for identification of crystal phases

(11) The aluminum-nitride-based composite material obtained in Example 31 was analyzed by ICP-AES (inductively-coupled plasma atomic emission spectrometry) for the content ratios of transition metals (excluding rare earth metals), alkali metals, and boron. For transition metals Fe, Ni, and Cr, alkali metals Li, Na, and K, and boron, the weight content ratio was lower than the limit of measurement, 100 ppm; thus, the weight content ratio was lower than 1000 ppm for all the elements tested. Therefore, the sintering step is free from the risk of contamination by any transition metal (excluding rare earth metals), alkali metal, or boron, and the content ratios of these elements cannot exceed those of impurities existing in starting mixtures, even after the mixtures are sintered. For every example, the weight content ratios of transition metals (excluding rare earth metals), alkali metals, and boron were all lower than 1000 ppm in starting materials; thus, none of these elements existed at a weight content ratio of 1000 ppm or higher in the resultant aluminum-nitride-based composite materials.

(12) Evaluation of bonding integrity between test disks and an alumina or yttria material: test specimens containing the material boundary were polished until a mirror surface appeared, and then the boundary was observed with an SEM with a magnification of 500; the result is ○ if no cracks were found, and the result is x if any crack was observed.

TABLE 3

| Sample number | Open porosity [%] | Bulk density [g/cm$^3$] | Four-point flexural strength [Mpa] | Fracture toughness, KIC [MPa√m] |
|---|---|---|---|---|
| Example 1 | 0.01 | 3.37 | 540 | — |
| Example 2 | 0.00 | 3.39 | 500 | — |
| Example 3 | 0.01 | 3.37 | 380 | — |
| Example 4 | 0.01 | 3.41 | 480 | — |
| Example 5 | 0.02 | 3.39 | 480 | — |
| Example 6 | 0.01 | 3.38 | 570 | — |
| Example 7 | 0.08 | 3.38 | 560 | 2.7 |
| Example 8 | 0.00 | 3.37 | 530 | 3.1 |
| Example 9 | 0.02 | 3.41 | 510 | — |
| Example 10 | 0.00 | 3.59 | 460 | 2.7 |
| Example 11 | 0.00 | 3.59 | 450 | 3.4 |
| Example 12 | 0.00 | 3.84 | 390 | 2.5 |
| Example 13 | 0.04 | 3.84 | 410 | 3.4 |
| Example 14 | 0.01 | 3.47 | 390 | 2.6 |
| Example 15 | 0.00 | 3.59 | 470 | 2.3 |
| Example 16 | 0.01 | 3.52 | 400 | 2.7 |
| Example 17 | 0.02 | 3.57 | 420 | 2.5 |
| Example 18 | 0.01 | 3.33 | 390 | — |
| Example 19 | 0.02 | 3.34 | 330 | — |
| Example 20 | 0.01 | 3.36 | 380 | — |
| Example 21 | 0.01 | 3.37 | 390 | — |
| Example 22 | 0.01 | 3.37 | 420 | — |
| Example 23 | 0.31 | 3.39 | 300 | — |
| Example 24 | 0.02 | 3.48 | 400 | — |
| Example 25 | 0.02 | 3.48 | 420 | — |
| Example 26 | 0.05 | 3.32 | 380 | — |
| Example 27 | 0.22 | 3.38 | 440 | — |
| Example 28 | 0.06 | 3.38 | 410 | — |
| Example 29 | 0.00 | 3.39 | 460 | — |

TABLE 3-continued

| Sample number | Open porosity [%] | Bulk density [g/cm$^3$] | Four-point flexural strength [Mpa] | Fracture toughness, KIC [MPa√m] |
|---|---|---|---|---|
| Example 30 | 0.01 | 3.39 | 480 | — |
| Example 31 | 0.01 | 3.41 | 470 | — |
| Example 32 | 0.02 | 3.41 | 480 | — |
| Example 33 | 0.03 | 3.39 | 420 | — |
| Example 34 | 0.00 | 3.38 | 410 | — |
| Comparative Example 1 | 3.63 | 2.92 | 260 | 3.9 |
| Comparative Example 2 | 0.06 | 3.32 | 110 | 2.5 |
| Comparative Example 3 | 0.01 | 4.13 | 320 | 2.1 |
| Comparative Example 4 | 0.02 | 3.87 | 410 | 2.1 |
| Comparative Example 5 | 0.00 | 3.60 | 410 | 2.3 |
| Comparative Example 6 | — | 2.53 | — | — |
| Comparative Example 7 | — | 2.29 | — | — |

TABLE 4

| Sample number | Heat conductivity [W/mK] | Thermal expansion coefficient [ppm/°C.] | Volume resistivity [Ωcm] | Etching rate | AlN grain diameter [μm] | Constitutional phases | Bonding integrity between alumina | Bonding integrity between yttria |
|---|---|---|---|---|---|---|---|---|
| Example 1 | 60 | 7.96 | — | — | 1 | AlN, MgO, YAL | ○ | ○ |
| Example 2 | 63 | 7.96 | — | — | 1 | AlN, MgO, YAL | ○ | ○ |
| Example 3 | 59 | 8.38 | — | — | 1 | AlN, MgO, YAM | — | — |
| Example 4 | 58 | 8.38 | — | — | 1 | AlN, MgO, YAM | ○ | ○ |
| Example 5 | 61 | 7.96 | — | — | 1 | AlN, MgO, YAM | ○ | ○ |
| Example 6 | 65 | 7.53 | — | — | 1 | AlN, MgO, YAM | ○ | ○ |
| Example 7 | 64 | 7.41 | 8.20E+15 | 0.33 | 1 | AlN, MgO, YAM | ○ | ○ |
| Example 8 | 51 | 7.38 | 5.70E+15 | 0.33 | 1.5 | AlN, MgO, YAM | — | — |
| Example 9 | 63 | 7.38 | — | — | 1 | AlN, MgO, Y$_2$O$_3$, YAM | ○ | ○ |
| Example 10 | 53 | 7.64 | 7.80E+15 | 0.33 | 1 | AlN, MgO, Y$_2$O$_3$, YAM | ○ | ○ |
| Example 11 | 45 | 7.64 | 9.00E+15 | 0.31 | 1 | AlN, MgO, Y$_2$O$_3$, YAM | — | — |
| Example 12 | 43 | 7.61 | 2.70E+15 | 0.35 | 1 | AlN, MgO, Y$_2$O$_3$, YAM | ○ | ○ |
| Example 13 | 40 | 7.61 | 7.80E+15 | 0.35 | 1 | AlN, MgO, Y$_2$O$_3$, YAM | — | — |
| Example 14 | 49 | 7.68 | 4.80E+15 | — | 1 | AlN, MgO, Y$_2$O$_3$, YAM, CaF$_2$ | — | — |
| Example 15 | 53 | 7.68 | 1.00E+16 | — | 1 | AlN, MgO, Y$_2$O$_3$, YAM, CaF$_2$ | ○ | ○ |
| Example 16 | 49 | 7.97 | 4.20E+15 | — | 1 | AlN, MgO, Y$_2$O$_3$, YAM, CaF$_2$ | — | — |
| Example 17 | 52 | 7.97 | 1.00E+16 | — | 1 | AlN, MgO, Y$_2$O$_3$, YAM, CaF$_2$ | ○ | ○ |
| Example 18 | 65 | 7.83 | | — | 1 | AlN, MgO, CaF$_2$ | — | — |
| Example 19 | 65 | 7.83 | | — | 1 | AlN, MgO, CaF$_2$ | ○ | ○ |
| Example 20 | 73 | 8.33 | | — | 1 | AlN, MgO, Y$_2$O$_3$, YAM, CaF$_2$ | — | — |
| Example 21 | 62 | 8.33 | 1.10E+15 | — | 1 | AlN, MgO, Y$_2$O$_3$, YAM, CaF$_2$ | ○ | ○ |
| Example 22 | 75 | 8.33 | 2.20E+15 | — | 1 | AlN, MgO, Y$_2$O$_3$, YAM, CaF$_2$ | — | — |
| Example 23 | 55 | 7.98 | 5.16E+14 | — | 1 | AlN, MgO, YAG, YOF | ○ | ○ |
| Example 24 | 65 | 8.01 | 5.16E+14 | — | 1 | AlN, MgO, YbAG, YbOF | — | — |
| Example 25 | 56 | 8.01 | 6.25E+14 | — | 1 | AlN, MgO, YbAG, YbOF | ○ | ○ |
| Example 26 | 58 | 7.96 | — | — | | AlN, MgO, CaO, CaAl$_2$O$_6$ | ○ | ○ |
| Example 27 | 60 | 8.01 | — | — | 1 | AlN, MgO, YAG, YOF | ○ | ○ |
| Example 28 | 65 | 8.02 | — | — | 1 | AlN, MgO, MgAl$_2$O$_4$, YOF | — | — |
| Example 29 | 68 | 7.99 | 1.5E+15 | — | 1 | AlN, MgO, YAG, YOF | ○ | ○ |
| Example 30 | 67 | 7.98 | 7.8E+14 | — | 1 | AlN, MgO, MgAl$_2$O$_4$, YOF | ○ | ○ |
| Example 31 | 58 | 7.97 | 9.6E+14 | — | 1 | AlN, MgO, YAG, YOF | ○ | ○ |
| Example 32 | 62 | 7.96 | 1.5E+15 | — | 1 | AlN, MgO, MgAl$_2$O$_4$, YOF | ○ | ○ |
| Example 33 | 56 | 8.02 | — | — | 1 | AlN, MgO, YAG, YOF | ○ | ○ |
| Example 34 | 59 | 8.03 | — | — | 1 | AlN, MgO, YAG, YOF | ○ | ○ |
| Comparative Example 1 | 27 | 7.38 | — | 0.48 | 1 | AlN, MgO | — | — |
| Comparative Example 2 | 38 | 7.38 | 8.50E+14 | 0.33 | 1.5 | AlN, MgO | — | — |
| Comparative Example 3 | 41 | 6.43 | 2.30E+11 | 0.61 | 1.5 | AlN, Y$_2$O$_3$, YAM | x | x |
| Comparative Example 4 | 65 | 6.12 | 7.90E+11 | 0.64 | 1.5 | AlN, Y$_2$O$_3$, YAM | x | x |
| Comparative Example 5 | 100 | 5.82 | 1.60E+12 | 0.83 | 1.5 | AlN, Y$_2$O$_3$, YAM | x | x |
| Comparative Example 6 | — | — | — | — | — | AlN, MgO, YAM, YAL, | — | — |
| Comparative Example 7 | — | — | — | — | — | AlN, MgO, MgAl$_2$O$_4$, YAM, YAL | — | — |

As shown in Tables and 4, Examples 1 to 13, whose constitutional phases consisted of AlN, MgO, and rare earth metal-aluminum complex oxide (YAL or YAM) phases, had a higher heat conductivity ($\geqq 40$ W/mK) than alumina with the volume resistivity ($\geqq 1\times 10^{14}$ Ω·cm) and thermal expansion coefficient (7.3 to 8.4 ppm/° C.) comparable to those of alumina. Furthermore, these examples were better than alumina in terms of corrosion resistant performance due to the MgO phase. However, Comparative Examples 1 and 2, whose constitutional phases consisted of AlN and MgO phases only, had as low a heat conductivity as 27 and 38 W/mK, respectively. Also, Comparative Examples 3 to 5, whose constitutional phases consisted of AlN, $Y_2O_3$, and YAM phases only, lacking MgO phase, had a substandard thermal expansion coefficient of lower than 6.5 ppm/° C. and an insufficient volume resistivity of lower than $1\times 10^{14}$ Ω·cm.

Examples 14 to 22, whose constitutional phases consisted of AlN, MgO, YAM, and $CaF_2$ phases or AlN, MgO, and $CaF_2$ phases, had a higher heat conductivity than alumina with the volume resistivity and thermal expansion coefficient comparable to those of alumina. Furthermore, these examples were better than alumina in terms of corrosion resistant performance due to the MgO phase and could be sintered at a lower temperature than Examples 1 to 13 due to $CaF_2$ added to their material powder. However, Comparative Examples 6 and 7, which had the same composition as Examples 20 to 22, were not densified because they were sintered under pressureless condition, not in a hot press. Examples 18 and 19 were excluded from volume resistivity measurement; however, the volume resistivity of these examples is presumably comparable to that of Comparative Example 2, or not less than $1\times 10^{14}$ Ω·cm, considering the results for Examples 1 to 17 suggesting that the addition of $CaF_2$ had little influence on volume resistivity and the result for Comparative Example 2, namely, a volume resistivity of higher than $1\times 10^{14}$ Ω·cm achieved with AlN and MgO phases only.

The constitutional phases of Examples 23 to 25 and 27 to 34 contained a phase of yttrium-aluminum complex oxide, ytterbium-aluminum complex oxide, or magnesium-aluminum complex oxide and another phase of yttrium oxide or ytterbium oxide besides AlN and MgO phases, and those of Example 26 contained calcium oxide and calcium-aluminum complex oxide phases besides AlN and MgO phases. As a result, these examples had a higher heat conductivity than alumina with the volume resistivity and thermal expansion coefficient comparable to those of alumina, were better than alumina in terms of corrosion resistant performance due to the MgO phase, and could be sintered at a lower temperature than Examples 1 to 13 due to the additional phases in their material powder, namely, $YF_3$, $YbF_3$, $MgF_2$, $AlF_3$, or CaO.

The present application claims the benefit of the priority from U.S. Provisional Application No. 61/107,756 filed on Oct. 23, 2008, Japanese Patent Application No. 2009-072305 filed on Mar. 24, 2009, and Japanese Patent Application No. 2009-216178 filed on Sep. 17, 2009, the entire contents of all of which are incorporated herein by reference.

What is claimed is:

1. A method for manufacturing an aluminum-nitride-based composite material, comprising a step of hot-press sintering of a mixture containing aluminum nitride at a content ratio in the range of 49.8 to 69.4 vol %; magnesium oxide at a content ratio in the range of 20.2 to 40.0 vol %; and a rare earth metal oxide at a content ratio in the range of 0.5 to 30.0 vol % and/or at least one selected from the group consisting of a rare earth metal fluoride, an alkali earth metal fluoride, calcium oxide, and aluminum fluoride at a content ratio in the range of 0.5 to 5.7 vol %; with the content ratios of transition metals, excluding rare earth metals, alkali metals, and boron, respectively as low as 1000 ppm or lower.

2. The method for manufacturing an aluminum-nitride-based composite material according to claim 1, wherein sintering temperature is in the range of 1350 to 1600° C.

3. The method for manufacturing an aluminum-nitride-based composite material according to claim 1, wherein two or more kinds of material particles constituting the mixture are combined into composite powder.

4. The method for manufacturing an aluminum-nitride-based composite material according to claim 3, wherein the composite powder is aluminum nitride particles coated with a rare earth metal oxide.

5. The method for manufacturing an aluminum-nitride-based composite material according to claim 3, wherein the composite powder is magnesium oxide particles coated with a rare earth metal oxide.

* * * * *